(12) United States Patent
Bessios

(10) Patent No.: US 6,543,023 B2
(45) Date of Patent: Apr. 1, 2003

(54) PARITY-CHECK CODING FOR EFFICIENT PROCESSING OF DECODER ERROR EVENTS IN DATA STORAGE, COMMUNICATION AND OTHER SYSTEMS

(75) Inventor: Anthony Bessios, Fremont, CA (US)

(73) Assignee: Agere Systems Inc., Allentown, PA (US)

(*) Notice: Subject to any disclaimer, the term of this patent is extended or adjusted under 35 U.S.C. 154(b) by 79 days.

(21) Appl. No.: 09/776,653

(22) Filed: Feb. 5, 2001

(65) Prior Publication Data

US 2002/0133778 A1 Sep. 19, 2002

(51) Int. Cl.⁷ .......................... H03M 13/00; G06F 11/00
(52) U.S. Cl. ......................................... 714/758; 714/800
(58) Field of Search .................................. 714/800, 801, 714/802, 804, 807, 752, 758, 763, 766, 767, 769, 770, 771, 772

(56) References Cited

U.S. PATENT DOCUMENTS 3,882,460 A * 5/1975 Bennett, Jr. .................. 714/800
4,397,022 A * 8/1983 Weng et al. ................. 714/704
4,736,376 A * 4/1988 Stiffler .......................... 714/703

OTHER PUBLICATIONS

A.J. Viterbi, "Error Bounds for Convolutional Codes and an Asymptotically Optimum Decoding Algorithm," IEEE Trans. on Information Theory, vol. IT–13, No. 2, pp. 260–269, Apr. 1967.

G.D. Forney, Jr., "Maximum–Likelihood Sequence Estimation of Digital Sequences in the Presence of Intersymbol Interference," IEEE Trans. on Information Theory, vol. IT–18, No. 3, pp. 363–378, May 1972.

G.D. Forney, Jr., "The Viterbi Algorithm," IEEE Proceedings, vol. 61, No. 3, pp. 268–277, Mar. 1973.

R.D. Gitlin et al., "Data Communications Principles," pp. 168–173, Plenum Press, New York, 1992.

* cited by examiner

Primary Examiner—Christine T. Tu
(74) Attorney, Agent, or Firm—Ryan, Mason & Lewis, LLP

(57) ABSTRACT

A sequence of information bits are parity-check coded in a parity generator utilizing an m+1-bit parity-check code. The m+1-bit parity-check code may be formed as a combination of an otherwise conventional m-bit parity-check code and an overall parity bit. The overall parity bit provides an indication of the parity of a plurality of composite or single error events associated with decoding of the parity codewords. The parity generator includes a single-parity encoder for generating the overall parity bit, and a parity generator matrix element for generating a codeword based on the m-bit parity-check code, with a given one of the codewords of the m+1-bit parity-check code formed as a combination of the codeword based on the m-bit parity-check code and the overall parity bit. The invention can be used with any conventional m-bit parity-check code to produce an m+1-bit enhanced parity-check code with K=N−m and rate $$\frac{N-m}{N+1},$$

where N+1 denotes the total number of bits in a given one of the m+1-bit parity codewords.

15 Claims, 5 Drawing Sheets

FIG. 6

$H_{7\times79} \longrightarrow N-K=7, N=79 \longrightarrow K=72$
$\longrightarrow \text{CODE RATE} = 72/79$ $$H_{79\times7}^T = \begin{bmatrix} h_1^T \\ h_2^T \\ \vdots \\ h_{79}^T \end{bmatrix}, \text{ WHERE } h_i^T = 1\times7$$

$H = [h_1 \ldots h_{79}], h_i = 7\times1$

PARITY-CHECK CODING FOR EFFICIENT PROCESSING OF DECODER ERROR EVENTS IN DATA STORAGE, COMMUNICATION AND OTHER SYSTEMS

FIELD OF THE INVENTION

The invention relates generally to data storage systems, communication systems and other types of systems which incorporate a Viterbi algorithm decoding process or other decoding process involving the processing of error events, and more particularly to parity-check coding techniques suitable for use in conjunction with channel coding in such systems.

BACKGROUND OF THE INVENTION

Channel coding is a conventional technique commonly used to increase the robustness of a data storage system or digital communication system. This technique is used in data storage applications such as the processing of data for storage on magnetic or optical disks. Channel coding is also used in many different types of communication systems, including voice-band modems, Asymmetric Digital Subscriber Line (ADSL) systems, audio broadcasting systems, Fast or Gigabit Ethernet systems, cellular systems and wireless local loop systems.

The principle underlying channel coding is to introduce redundancy and memory into a transmitted bit stream so as to facilitate error detection and correction at the decoder. Two general classes of channel codes are block codes and trellis codes. Block codes operate on a block-by-block basis, such that output code words depend only on the current input block message. Trellis codes, in contrast, may be viewed as mapping one arbitrarily long bit stream into another, with no assumed block structure.

One important category of block codes is the class of run-length limited (RLL) codes. The codewords of an RLL code are run-length limited binary sequences of a fixed length n, also known as (d,k) sequences, and are characterized by the parameters d and k, which indicate the minimum and maximum number of "zeros" between consecutive "ones" in the binary sequence, respectively. Such codes are typically used for high density recording channels in a data storage system.

Convolutional codes are a commonly-used linear class of trellis codes. In such codes, output codewords result from the convolution of an input message stream with the impulse response of an encoder which includes a v-stage shift register. A given n-bit code word is generated as a function of k input bits and v bits stored in the shift register. The constraint length K of the encoder is defined as k+v, and the rate of the code is given by k/n, where n>k. A convolutional encoder thus operates as a finite state machine with a maximum of $2^v = 2^{K-m}$ possible states. The k input bits cause a transition from a present state, defined by v bits, to the next state, and the number of output bits, i.e., code bits, produced depends on the rate of the code.

The Viterbi algorithm is an efficient maximum-likelihood sequence detection method for use in conjunction with the decoding of block or trellis codes transmitted over Additive White Gaussian Noise (AWGN) channels. The Viterbi algorithm is described in, e.g., A. J. Viterbi, "Error Bounds for Convolutional Codes and an Asymptotically Optimum Decoding Algorithm," IEEE Trans. on Information Theory, Vol. IT-13, April 1967; G. D. Forney, Jr., "Maximum-likelihood sequence detection in the presence of intersymbol interference," IEEE Trans. on Information Theory, Vol. IT-18, pp. 363–378, May 1972; and G. D. Forney, Jr., "The Viterbi algorithm," IEEE Proceedings, Vol. 61, pp. 268–278, March 1973, all of which are incorporated by reference herein. The algorithm decodes received bits or symbols by finding the most likely path through a time-expanded state transition diagram called a trellis.

Parity-check codes are often utilized in conjunction with the above-described channel codes. For example, such parity-codes are often used for post-processing of error events generated by a maximum-likelihood sequence detector based on the Viterbi algorithm. More particularly, it is known in the art to utilize an m-bit parity check code in order to associate each of a number of dominant error events that may be generated by the Viterbi algorithm with a corresponding unique syndrome. In this manner, each of the dominant error events can be uniquely identified, and an appropriate corrected output can be generated for each error event. Additional details regarding conventional parity-check coding can be found in, e.g., Richard D. Gitlin et al., "Data Communications Principles," pp. 168–173, Plenum Press, New York, 1992, which is incorporated by reference herein.

Conventional parity-check coding has a number of significant disadvantages. For example, the use of an m-bit code to assign each error event a unique syndrome requires storage of a substantial list of syndrome-event pairs in a lookup table. Increasing the number of lookup table entries increases the complexity of the decoding process and the cost of the corresponding decoder. In addition, as the parity-check code word block size N increases and the operating signal-to-noise ratio (SNR) decreases, combinations of certain error events may produce common non-unique syndromes. In many applications it is desirable to utilize large parity-check code block lengths N with a relatively small number of parity-check code bits m in order to keep the parity-check code rate as high as possible. However, the number of available unique syndromes is given by $2^m$, such that limiting the number of parity-check bits m also limits the number of unique syndromes. In the presence of this higher amount of ambiguity, it is often necessary to choose from among several candidate error events one particular error event to be corrected, and there is only a limited probability of choosing the right candidate. The numerous non-unique syndromes in conventional m-bit parity-check coding can thus result in a large error miscorrection rate.

A need therefore exists for improved parity-check coding which can reduce the number of lookup table entries required, while also improving performance by increasing the probability of selecting the appropriate error event for correction.

SUMMARY OF THE INVENTION

The present invention provides improved parity-check coding for processing of Viterbi algorithm error events or other decoding-related error events in a data storage system, communication system or other type of system.

In accordance with the invention, a sequence of information bits are parity-check coded in a parity generator utilizing an m+1-bit parity-check code. The m+1-bit parity-check code may be formed as a combination of an otherwise conventional m-bit parity-check code and an overall parity bit. The additional overall parity bit provides an indication of the parity of a plurality of composite or single error events associated with decoding of the parity codewords. The parity generator includes a single-parity encoder for generating the overall parity bit, and a parity generator matrix element for generating a codeword based on the m-bit parity-check code, with a given one of the codewords of the m+1-bit parity-check code formed as a combination of the codeword based on the m-bit parity-check code and the overall parity bit. The invention can be used with any conventional m-bit parity-check code to produce an m+1-bit enhanced parity-check code with K=N−m and rate $$\frac{N-m}{N+1},$$

where N+1 denotes the total number of bits in a given one of the m+1-bit parity codewords.

Advantageously, the invention results in substantial improvements in decoding complexity by reducing the number of required lookup table entries by a factor of one-half, which significantly decreases decoder memory requirements and access time. In addition, the invention significantly improves decoding performance by increasing the probability of choosing the appropriate error event for correction to thereby produce a lower error miscorrection rate.

BRIEF DESCRIPTION OF THE DRAWINGS

FIG. 6 shows additional details of the specific code example for which the decoding process is illustrated in FIG. 5.

DETAILED DESCRIPTION OF THE INVENTION

The present invention will be illustrated herein in conjunction with a number of example systems which incorporate a parity-check coding process suitable for post-processing of Viterbi algorithm error events. It should be understood, however, that the invention does not require any particular system configuration. The invention is more generally applicable to any data storage system, communication system or other type of system application in which parity-check coding may be used to facilitate post-processing of error events.

The illustrative embodiments of the invention are configured to provide an m+1 bit parity check code suitable for correction of composite or single error events for each parity-check code block. In accordance with the invention, the m+1 bit parity check code is generated by using an additional overall parity bit $p_{m+1}$ in conjunction with a conventional m-bit parity check code of the type described previously. The invention simplifies the list of candidate error events during decoding by utilizing the overall parity bit $p_{m+1}$ to provide information regarding composite or single error event parity.

Figure 3:
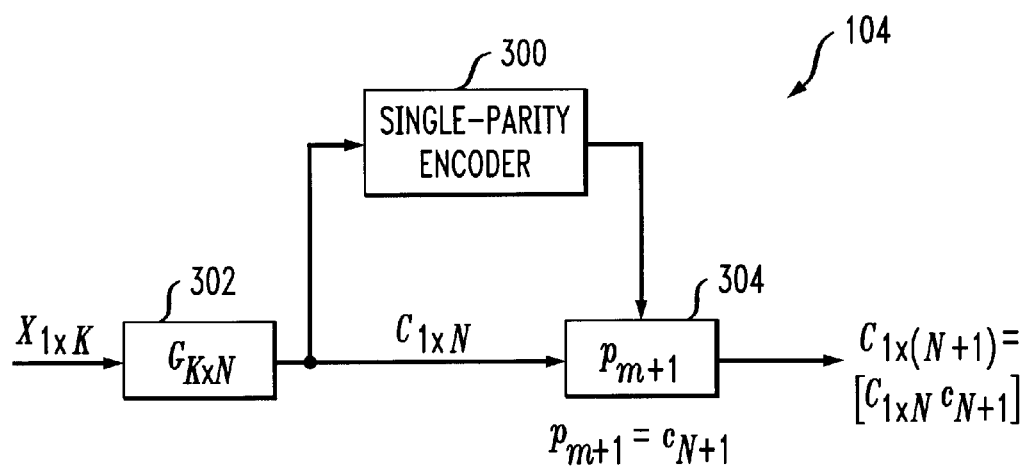
FIG. 3 shows an example parity generator configured in accordance with the invention and suitable for use in the systems of FIGS. 1 and 2.

The overall parity bit $p_{m+1}$ is also referred to herein as the N+1 bit $c_{N+1}$ of a codeword $C_{1\times(N+1)}$ of the m+1 bit parity check code. Generation of the codeword $C_{1\times(N+1)}$ is illustrated in FIG. 3. The received version of the overall parity bit is denoted $r_{m+1}$, or as the N+1 bit $r_{N+1}$ of a received codeword $R_{1\times(N+1)}$ of the m+1 bit parity check code. Processing of the received codeword $R_{1\times(N+1)}$ is described in conjunction with FIGS. 4 and 5.

As noted above, it is desirable in many communication system applications to utilize large parity-check code block lengths N with a relatively small number of parity-check code bits m in order to keep the parity-check code rate as high as possible. Minimizing m creates problems by limiting the number of unique syndromes and thereby increasing the error miscorrection rate. As will be described in greater detail below, the present invention is able to increase the total number of parity-check bits from m to m+1, thereby doubling the number of available syndromes from $2^m$ to $2^{m+1}$ without increasing the number of required lookup table entries.

Advantageously, the invention results in substantial improvements in decoding complexity. More particularly, the invention in the illustrative embodiments reduces the number of required lookup table entries by a factor of one-half, and thereby reduces decoder memory requirements and access time. In addition, the invention significantly improves decoding performance by increasing the probability of choosing the appropriate error event for correction, and thereby producing a lower error miscorrection rate.

Figure 1:
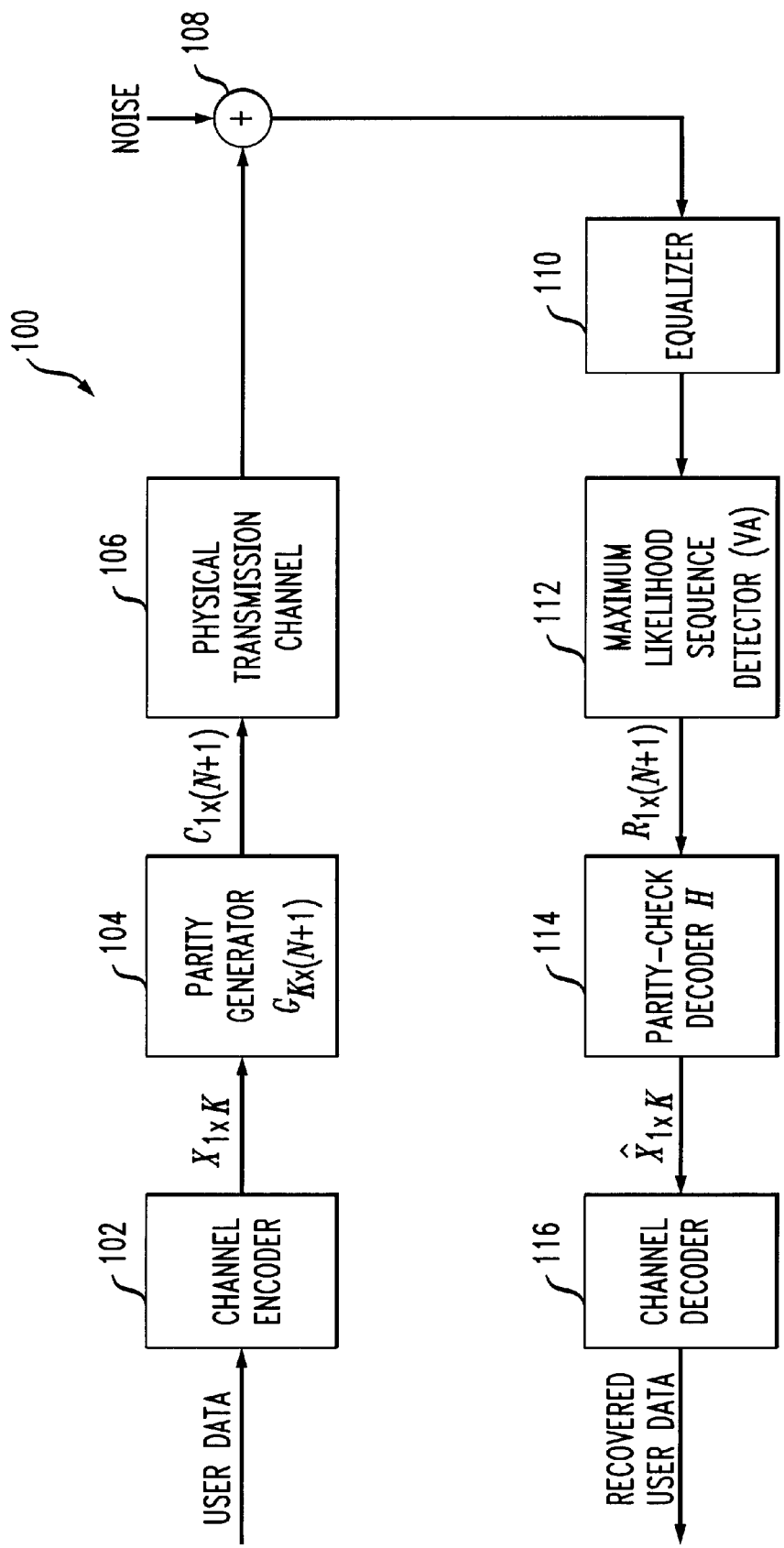
FIG. 1 is a block diagram of a first illustrative embodiment of a system which incorporates an improved parity-check coding feature in accordance with the invention.
Figure 2:
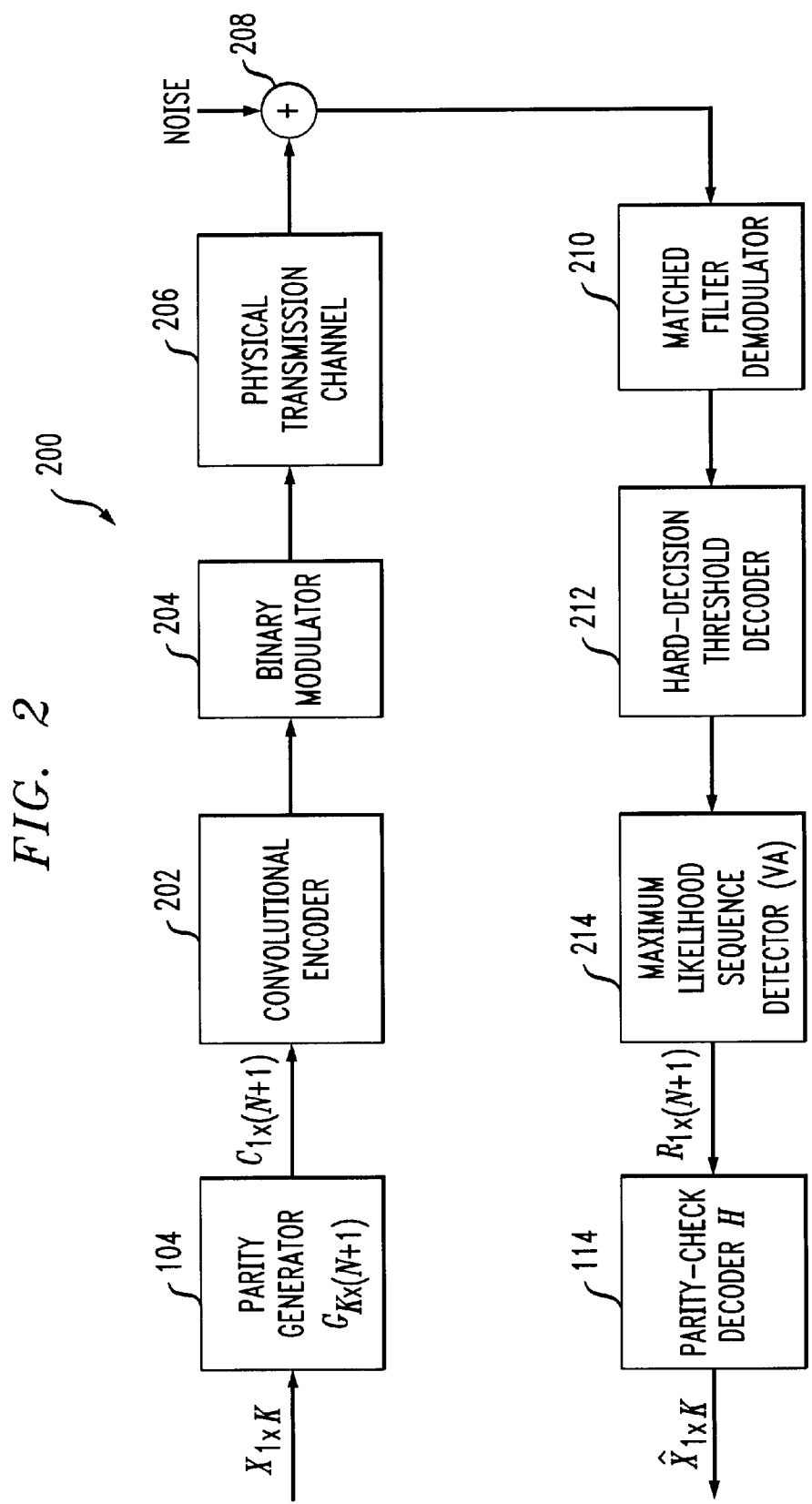
FIG. 2 is a block diagram of a second illustrative embodiment of a system which incorporates an improved parity-check coding feature in accordance with the invention.

FIGS. 1 and 2 show example systems each having a parity-check coding feature in accordance with the present invention. These systems may be viewed as data storage systems or communication systems, or may be used in other applications.

FIG. 1 shows a system 100 with a parity-check coding feature in accordance with a first illustrative embodiment of the invention. A transmitter portion of the system 100 includes a channel encoder 102 and a parity generator 104. User data is applied to a channel encoder 102, which in this embodiment may be a conventional block coder which implements a run-length limited (RLL) code. The output of the channel encoder 102 is a channel-coded sequence $X_{1\times K}$ and is applied to the parity generator 104 having a parity generator matrix $G_{K\times(N+1)}$ associated therewith. The output of the parity generator 104 is a parity codeword $C_{1\times(N+1)}$. The parity codeword is transmitted over a physical transmission channel 106 that is subject to inter-symbol interference (ISI) and additive white Gaussian noise (AWGN) as illustrated by summing element 108. The physical transmission channel 106 may be, e.g., a storage channel associated with a fixed magnetic or optical disk of a data storage system, or a transmission channel of a communication system, and in this embodiment has associated therewith a transfer function F(D), where F(D) is a polynomial of a variable D, e.g., $F(D)=f_0+f_1 D+f_2 D^2+\ldots+f_Q D^Q$.

A receiver portion of the system 100 includes an equalizer 110, a maximum-likelihood sequence detector 112 based on the Viterbi algorithm, a parity-check decoder 114 having a decoder matrix H, and a channel decoder 116. The transmission channel 106 in conjunction with the noise summing element 108 and the equalizer 110 provide an equalized target transfer function T(D) having a memory L. The maximum-likelihood sequence detector 112 utilizes the Viterbi algorithm to generate a received parity codeword $R_{1\times(N+1)}$ that is applied as an input to the parity-check decoder 114. The parity-check decoder 114 processes the received parity codeword $R_{1\times(N+1)}$ to generate an estimated output channel-coded sequence $\hat{X}_{1\times K}$ that represents an estimate of the channel-coded sequence $X_{1\times K}$. As will be described in greater detail in conjunction with FIGS. 4 and 5 below, this processing generally involves taking the product of the received codeword and $H^T$, where $H^T$ denotes the transpose of the decoder matrix H, and using the resulting syndrome as an input to a lookup table to identify a corresponding error event associated with the Viterbi algorithm. The estimated output sequence $\hat{X}_{1\times K}$ from the parity-check decoder 114 is applied to the channel decoder 116, which generates recovered user data therefrom.

The operation of the parity generator 104 and parity-check decoder 114 will be described in greater detail in conjunction with FIGS. 3 and 4, respectively.

FIG. 2 shows a system 200 having a parity-check coding feature in accordance with a second illustrative embodiment of the invention. A transmitter portion of the system 200 includes parity generator 104 having the parity generator matrix $G_{K\times(N+1)}$, as previously described, as well as a convolutional encoder 202 and a binary modulator 204. An input sequence $X_{1\times K}$ is generated from user data and applied to the parity generator 104. The output of the parity generator 104 is a parity codeword $C_{1\times(N+1)}$. The parity codeword is then channel coded in the convolutional encoder 202, which in this embodiment has an equalized target transfer function T(D) with memory L, where T(D) is a polynomial of the variable D, e.g., $T(D)=t_0+t_1D+t_2D^2+ \ldots +t_LD^L$, and L<Q. The channel coded output of the convolutional encoder 202 is applied as an input to the binary modulator 204, which may be, e.g., a conventional non-return-to-zero (NRZ) modulator. The resulting modulated output is transmitted over a physical transmission channel 206 that is subject to AWGN as illustrated by summing element 208.

A receiver portion of the system 200 includes a matched filter demodulator 210, a hard-decision threshold decoder 212, a maximum-likelihood sequence detector 214 based on the Viterbi algorithm, and the parity-check decoder 114 having the parity-check decoder matrix H. The matched filter demodulator 210 demodulates the modulation applied by binary modulator 204, and the hard-decision threshold decoder 212 operates in conjunction with the maximum-likelihood sequence detector 214 to generate a received parity codeword $R_{1\times(N+1)}$ that is applied as an input to the parity-check decoder 114. The parity-check decoder 114 processes the received parity codeword $R_{1\times(N+1)}$ to generate an estimated output sequence $\hat{X}_{1\times K}$ that represents an estimate of the input sequence $X_{1\times K}$. The estimated output sequence $\hat{X}_{1\times K}$ from the parity-check decoder 114 may be further processed to generate recovered user data therefrom.

FIG. 3 shows a more detailed view of the parity generator 104 of systems 100 and 200. As noted previously, the parity generator 104 receives as input the sequence $X_{1\times K}$ and generates as output the parity codeword $C_{1\times(N+1)}$. The parity generator 104 has parity generator matrix $G_{K\times(N+1)}$. As shown in FIG. 3, the parity generator 104 includes a single-parity encoder 300 and a parity-check matrix element 302 having a parity-check matrix $G_{K\times N}$. The parity-check matrix element 302 receives as input the sequence $X_{1\times K}$. The parity-check matrix element 302 processes the sequence $X_{1\times K}$ using the matrix $G_{K\times N}$ to generate a codeword $C_{1\times N}$. The single-parity encoder 300 receives as input the codeword $C_{1\times N}$ and generates there from the above-noted overall parity bit $p_{m+1}$ designated as element 304 in the figure. The codeword $C_{1\times N}$ is then combined with the overall parity bit $p_{m+1}$ to provide the output codeword $C_{1\times(N+1)}$ as shown. The output codeword $C_{1\times(N+1)}$ thus includes the overall parity bit $p_{m+1}$ appended to the codeword $C_{1\times N}$. As noted previously, the overall parity bit $p_{m+1}$ is also referred to herein as the N+1 bit $c_{N+1}$ of the output codeword $C_{1\times(N+1)}$ of the m+1-bit parity check code.

Figure 4:
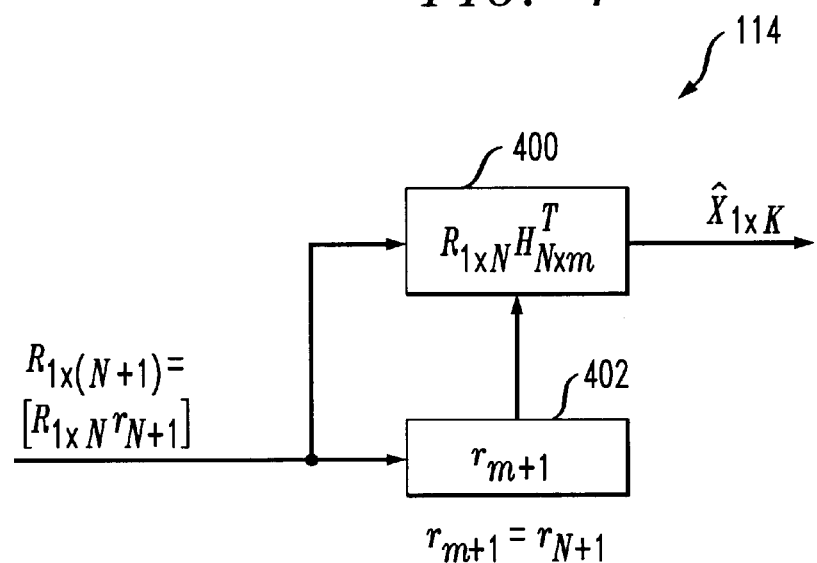
FIG. 4 shows an example parity-check decoder configured in accordance with the invention and suitable for use in the systems of FIGS. 1 and 2.

FIG. 4 shows a more detailed view of the parity-check decoder 114 of systems 100 and 200.

As noted previously, the parity-check decoder 114 has a parity-check decoder matrix H and processes the received parity code word $R_{1\times(N+1)}$ to generate an estimated output sequence $\hat{X}_{1\times K}$ that represents an estimate of the input sequence $X_{1\times K}$. The parity-check decoder 114 as shown in FIG. 4 includes elements 400 and 402. Element 400 generates the product $R_{1\times N} H^T_{N\times m}$ using the $R_{1\times N}$ portion of the received codeword $R_{1\times(N+1)}$. The values of the $R_{1\times N} H^T_{N\times m}$ product and a received version $r_{m+1}$ of the overall parity bit $p_{m+1}$ are then used to determine the estimated output sequence $\hat{X}_{1\times K}$ as follows:

1. If $R_{1\times N}H^T_{N\times m} \neq 0$ and the received overall parity bit $r_{m+1}$ indicates an error, then only odd-parity composite or single error event candidates are considered in generating the output sequence.

2. If $R_{1\times N}H^T_{N\times m} \neq 0$ and the received overall parity bit $r_{m+1}$ does not indicate an error, then only even-parity composite or single error event candidates are considered in generating the output sequence.

3. If $R_{1\times N} H^T_{N\times m}=0$ and the received overall parity bit $r_{m+1}$ indicates an error, then there is a detected error but the detected error cannot be corrected.

4. If $R_{1\times N}H^T_{N\times m}=0$ and the received overall parity bit $r_{m+1}$ does not indicate an error, then there is no detected error.

As noted previously, the received overall parity bit $r_{m+1}$ is also referred to herein as the N+1 bit $r_{N+1}$ of the received codeword $R_{1\times(N+1)}$. The term "composite error event" as used herein refers generally to combinations of two or more single error events which collectively produce a non-zero syndrome (a syndrome should generally be different than zero in order to be meaningful) and are listed as candidates to be corrected due to their higher probability of occurrence from channel characteristics such as channel bit density, signal-to-noise ratio (SNR), etc. The parity of a given composite or single error event per parity-check code block refers generally to the total count of single bit errors forming the composite or single error event. If the total count of single bit errors is an odd number, the corresponding error event is an odd-parity error event. Similarly, if the total count of single bit errors is an even number, the corresponding error event is an even-parity error event.

In general, when using even parity, if $R_{1\times N}$ is odd and $r_{N+1}=0$ or if $R_{1\times N}$ is even and $r_{N+1}=1$, odd-parity error events can be detected, while even-parity error events remain undetected. Similarly, when using odd parity, if $R_{1\times N}$ is even and $r_{N+1}=0$ or if $R_{1\times N}$ is odd and $r_{N+1}=1$, odd-parity error events can be detected, while even-parity error events remain undetected.

The product of the received codeword $R_{1\times N}$ and $H^T_{N\times m}$ may be written as follows:

$$R_{1\times N}H^T_{N\times m}=E^i_{1\times N}H^T_{N\times m}=S^i, i=1, 2, \ldots m,$$

where $E^i_{1\times N}$ is an error vector, and $S^i$ is a syndrome. The parity-check matrix $H_{N\times m}$ is given by $[h_1, \ldots h_j \ldots h_N]$, where $h_i$ is an m×1 vector and $h^i_1$ is a 1×m vector, and m=N−K. A given single error event after being multiplied by $H^T$ can therefore be written as:

$$h_j e_{j1} + \ldots + h_{j+q-1} e_{jq} = S^d,$$

while a double error event after being multiplied by $H^T$, assuming a channel with memory L, is given by:

$$[h_i e_{i1} + h_{i+1} e_{i2} + \ldots + h_{i+n-1} e_{in}] + [h_k e_{k1} + h_{k+i} e_{k+1} e_{k2} + \ldots + h_{k+1-i} e_{k1}] = S^i.$$

An error event multiplied by $H^T$ in the above formulation is thus a linear combination of rows of $H^T$. It should be noted that, in the above formulation, a number of conditions apply. First, the second error event starts after the first error event ends, i.e., $k > i+n-1$. Second, the error events are independent, i.e., $k-i > L$. Third, $q \leq L$. Finally, $n+1 \leq N$. For a given detected odd error event under these conditions:

$$e_{i1} + \ldots + e_{in} + e_{k1} + \ldots + e_{kl} = 1.$$

Figure 5:
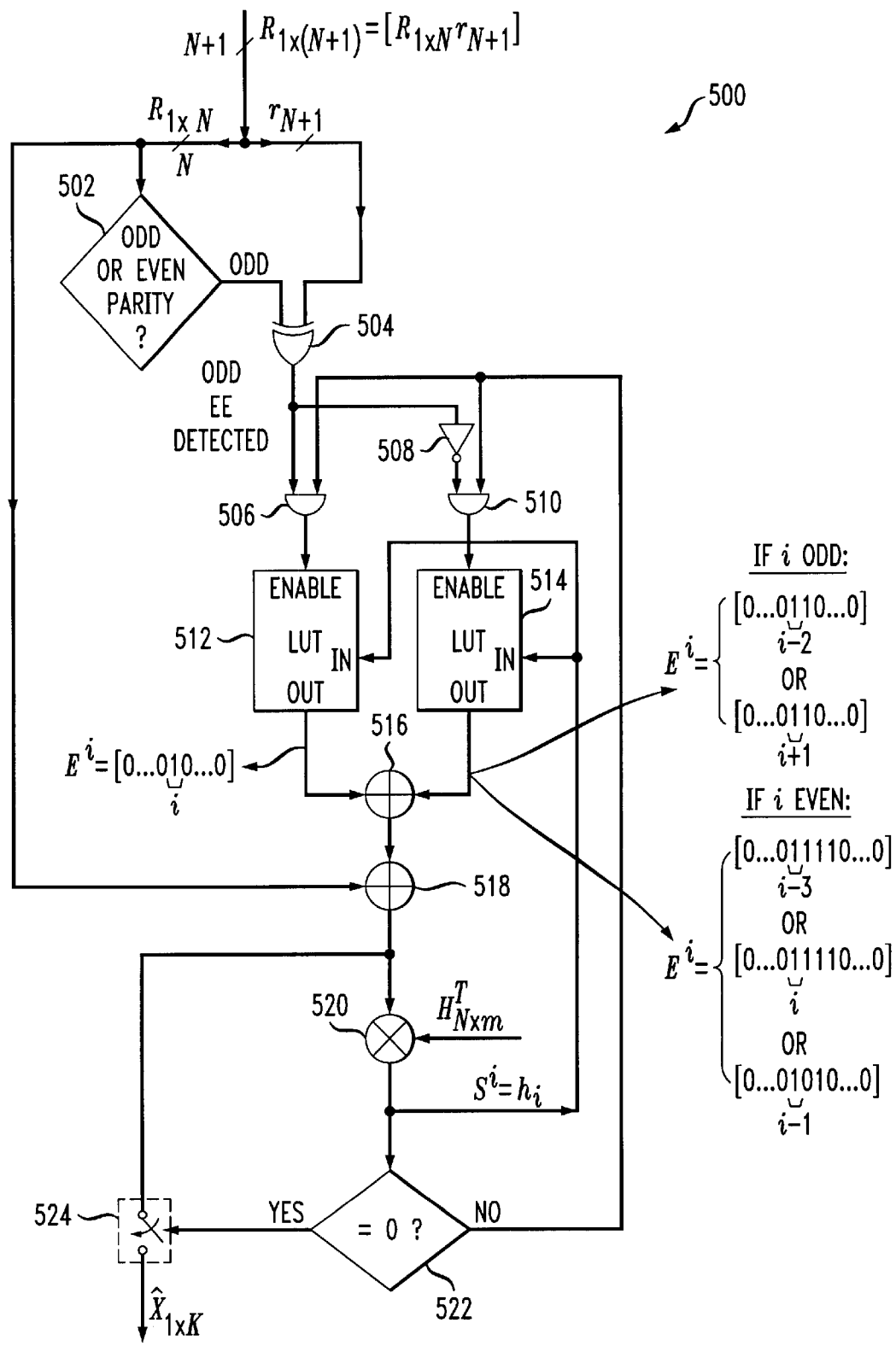
FIG. 5 shows a more detailed functional diagram of a parity-check decoder in accordance with the invention as implemented for a specific code example.

A specific code example will now be described in conjunction with FIGS. 5 and 6. FIG. 5 illustrates the decoder processing for this example, and FIG. 6 shows other details of the code example. The code example detects and corrects all single-bit errors $e_i$ (odd-parity error events) and double-bit and quadruple-bit errors (even-parity error events).

In this example, the relationship between the columns $h_i$ of the parity-check matrix H is given by $h_i \oplus h_{i+1} \oplus h_{i+2} = 0$ for i odd, and $h_i \oplus h_{i+1} \oplus h_{i+2} \neq 0$ for i even. In addition, for i odd, $h_i \oplus h_{i+1} = h_{i+3} \oplus h_{i+4} = _{i+2}$, and $h_i \oplus h_{i+1} \oplus h_{i+2} \oplus h_{i+3} = h_{i-3} \oplus h_{i+4} \oplus h_{i+5} \oplus h_{i+6} = h_{i+3} = h_{i+2} \oplus h_{i+4}$. Therefor, for odd-parity error events, the syndrome S is given by $h_i$, and the candidate errors to detect and correct are single-bit errors of the form $e_i$. For even-parity error events, the syndrome S is given by $h_i$ for i odd, in which case the candidate errors to detect and correct are double-bit errors are of the form $(e_{i-2}, e_{i-1})$ or $(e_{i+1}, e_{i+2})$, or h, for i even, in which case the candidate errors to detect and correct are of the form $(e_{i-3}, e_{i-2}, e_{i-1}, e_i)$, $(e_i, e_{i-1}, e_{i+2}, e_{i+3})$ or $(e_{i-1}, e_{i+1})$.

Referring to FIG. 5, the received codeword $R_{1 \times (N+1)} = [R_{1 \times} r_{N+1}]$ is processed in the manner shown in the functional diagram 500 in order to generate the estimated output sequence $\hat{X}_{1 \times K}$. It is assumed for this example that odd parity is being used, although it will be apparent to those skilled in the art that with minor modification even parity may be used. Decision block 502 determines the detected parity. The output of block 502 is applied to one input of a two-input exclusive-OR gate 504. The other input of the exclusive-OR gate 504 is the received overall parity bit $r_{N+1}$. The output of the exclusive-OR gate 504 is applied in uncomplemented form to an input of two-input AND gate 506, and is applied in complemented form via inverter 508 to an input of two-input AND gate 510. The other inputs of AND gates 506 and 510 are coupled to an output of a decision block 522.

Outputs of the AND gates 506 and 510 drive enable inputs of respective lookup tables (LUTs) 512 and 514. The input of the LUTs 512 and 514 is a syndrome $S^i = h_i$. The outputs of the LUTs 512 and 514 are the previously-described error events $E^i_{1 \times N}$ (denoted simply as $E^i$ in this example). More particularly, the output of LUT 512 (odd-parity error event) is a single-bit error $E^i$ of the type shown in the figure, while the output of LUT 514 (even-parity error event) is a double-bit error $E^i$ (if i is odd) or a quadruple-bit or double-bit error $E^i$ (if i is even). These outputs pass via adder 516 to an adder 518 which combines the designated error event $E^i$ with the codeword $R_{1 \times N}$. The output of the adder 518 is applied to a multiplier 520 and to an input of a switch 524. The multiplier 520 takes the product of the output of adder 518 and $H^T_{N \times m}$ to generate the syndrome $S^i = h_i$ that is supplied as input to the LUTs 512 and 514. Decision block 522 determines if the product generated by multiplier 520 is zero. If it is, switch 524 is closed and the estimated output sequence $\hat{X}_{1 \times K}$ is generated as the output of adder 518. If the product generated by multiplier 520 is not zero, gates 506 and 510 are enabled as shown.

FIG. 6 shows additional details of the code example. More particularly, FIG. 6 shows the parity-check matrix $H_{N \times m}$ for the m-bit parity code, where m=N−K=7, and N=79, so K=72 and the code rate of the original m-bit parity-check code is given by K/N=72/79. As noted previously, the parity-check matrix may be written as $H_{N \times m} = [h_1 \ldots h_N]$, where $h_i$ is an m×1 vector and $h_i^T$ is a 1×m vector. The code rate of the corresponding m+1-bit parity-check code formed in accordance with the techniques of the invention is N−m/(N+1)=K/(N+1)=72/80. The corresponding transpose matrix $H^T_{N \times m} = H^T_{79 \times 7}$. As noted previously, the code in this example detects and corrects all single-bit errors (odd-parity error events), and double-bit errors of the type 11 or 101 and quadruple bit errors of the type 1111 (even-parity error events).

It should be appreciated that the particular code described in conjunction with FIGS. 5 and 6 is shown by way of example only, and is not intended to limit the scope of the invention in any way.

In the above-described illustrative embodiments, the overall parity bit $p_{m+1}$ provides an overall parity check of even-parity or odd-parity composite or single error events. The overall parity bit thus allows information regarding the overall parity of these composite or single error events to be extracted from a given received sequence. As noted above, the single-parity check fails when an odd-parity composite or single error event occurs in a given parity-check code block, while the single-parity check does not fail when an even-parity composite or single error event occurs in the code block.

The use of the overall parity bit therefore reduces the number of composite or single error events having a common syndrome, since only odd-parity error event candidates are considered when the single-parity check fails and only even-parity error event candidates are considered when the single-parity check does not fail.

As previously noted, this provides a significant reduction in the complexity of the required lookup tables. In addition, the number of available unique syndromes is doubled, since the same list can be used separately by the odd-parity and even-parity candidate error events. Furthermore, the error miscorrection rate is reduced, since in many cases there will be a smaller list of competing composite or single candidate error events from which to choose. It should be noted that an additional minor reduction in the probability of missing an error is also provided, since there will be cases where an m-bit parity-check code might indicate no error, while the additional single-parity of check indicates an error.

The illustrative embodiments described above may be implemented using any desired value for m. For example, the invention may be used with a conventional 4-bit parity-check code to provide a 5-bit enhanced parity check code, or with a conventional 8-bit parity check code to form a 9-bit enhanced parity check code. More generally, the present invention can be used with any conventional m-bit parity-check code to produce an m+1-bit parity-check code with K=N−m and rate $$\frac{N-m}{N+1},$$

where N+1 denotes the total number of bits in a given one of the m+1-bit parity codewords.

In the illustrative embodiments described above, it is assumed that the overall parity bit $p_{m+1}$ is appended to the end of the codeword, so that $p_{m+1}=c_{N+1}$. It should be understood that this is by way of example only. The overall parity bit $p_{m+1}$ need not be placed in the last position of the codeword, i.e., position N+1, but could more generally be placed in any desired position i, where $1 \leq i \leq N+1$.

The above-described illustrative embodiments may be implemented in hardware, software or combinations of hardware and software. For example, the computations and other processing operations referred to in conjunction with FIGS. 3 and 4 above may be implemented using hardware and/or software elements of a decoder such as Viterbi decoder, a post-processor associated with a decoder, an application-specific integrated circuit (ASIC) or any other digital data processing device for use in, e.g., a data storage device or a communication system receiver, as well as portions or combinations of these and other devices.

Although the illustrative embodiments of the present invention have been described herein with reference to the accompanying drawings, it is to be understood that the invention is not limited to these precise embodiments, and that various other changes and modifications may be made therein by one skilled in the art without departing from the scope of the invention as set forth in the appended claims.

What is claimed is:

1. A method for parity-check coding of a sequence of information bits, the method comprising the steps of:

receiving a sequence of information bits to be subject to the parity-check coding; and applying the sequence of information bits to a parity generator to generate one or more corresponding parity codewords, the parity codewords including the information bits in an encoded form, the parity generator utilizing an m+1-bit parity-check code comprising a combination of an m-bit parity-check code and an overall parity bit, the overall parity bit providing an indication of the parity of a plurality of composite or single error events associated with decoding of the parity codewords;

the one or more parity codewords of the m+1-bit parity-check code being decodable in a parity-check decoder;

wherein the parity-check decoder processes a given received parity codeword $R_{1 \times (N+1)}$ to generate an estimated output sequence $\hat{X}_{1 \times K}$ that represents an estimate of an input sequence $X_{1 \times K}$; and wherein the parity-check decoder generates a product $R_{1 \times N} H^T_{N \times m}$ using an $R_{1 \times N}$ portion of the given received parity codeword $R_{1 \times (N+1)}$, and utilizes values of the $R_{1 \times N} H^T_{N \times m}$ product and a received version $r_{m+1}$ of the overall parity bit to determine the estimated output sequence $\hat{X}_{1 \times K}$ as follows:

(i) if $R_{1 \times N} H^T_{N \times m} \neq 0$ and the received overall parity bit $r_{m+1}$ indicates an error, then only odd-parity composite or single error event candidates are considered in generating the output sequence;

(ii) if $R_{1 \times N} H^T_{N \times m} \neq 0$ and the received overall parity bit $r_{m+1}$ does not indicate an error, then only even-parity composite or single error event candidates are considered in generating the output sequence;

(iii) if $R_{1 \times N} H^T_{N \times m} \neq 0$ and the received overall parity bit $r_{m+1}$ indicates an error, then there is a detected error but the detected error cannot be corrected; and (iv) if $R_{1 \times N} H^T_{N \times m} \neq 0$ and the received overall parity bit $r_{m+1}$ does not indicate an error, then there is no detected error.

2. The method of claim 1 wherein the m+1-bit parity-check code is characterized by a value of K=N−m and a rate $$\frac{N-m}{N+1},$$

where N+1 denotes the total number of bits in a given one of the parity codewords.

3. The method of claim 1 wherein the parity generator comprises a single-parity encoder for generating the overall parity bit and a parity generator matrix element for generating an initial codeword based on the m-bit parity-check code, and wherein a given one of the parity codewords of the m+1-bit parity-check code comprises a combination of the initial codeword based on the m-bit parity-check code and the overall parity bit.

4. The method of claim 3 wherein the parity-check matrix element has associated therewith a parity-check matrix $G_{K \times N}$ and processes the input sequence $X_{1 \times K}$ using the matrix $G_{K \times N}$ to generate an initial codeword $C_{1 \times N}$ based on the m-bit parity-check code.

5. The method of claim 3 wherein the single-parity encoder processes the input sequence $X_{1 \times K}$ to generate an overall parity $p_{m+1}$, wherein the overall parity $p_{m+1}$ is combined with an initial codeword $C_{1 \times N}$ based on the m-bit parity-check code to generate the given one of the parity codewords of the m+1-bit parity-check code.

6. The method of claim 1 wherein the composite error event comprises a combination of two or more single error events which collectively produce a non-zero syndrome.

7. The method of claim 1 wherein the parity of a given one of the composite or single error events for a given block of the m+1-bit parity-check code comprises a total count of single bit errors forming the composite or single error event.

8. The method of claim 1 wherein the parity generator comprises an element of a data storage system.

9. The method of claim 1 wherein the parity generator comprises an element of a communication system.

10. An apparatus for parity-check coding of a sequence of information bits, the apparatus comprising:

a parity generator having an input for receiving a sequence of information bits to be subject to the parity-check coding, the parity generator generating one or more corresponding parity codewords utilizing an m+1-bit parity-check code comprising a combination of an m-bit parity-check code and an overall parity bit, the parity codewords including the information bits in an encoded form, the overall parity bit providing an indication of the parity of a plurality of composite or single error events associated with decoding of the parity codewords;

the one or more parity codewords of the m+1-bit parity-check code being decodable in a parity-check decoder;

wherein the parity-check decoder processes a given received parity codeword $R_{1 \times (N+1)}$ to generate an estimated output sequence $\hat{X}_{1 \times K}$ that represents an estimate of an input sequence $X_{1 \times K}$; and wherein the parity-check decoder generates a product $R_{1 \times N} H^T_{N \times m}$ using an $R_{1 \times N}$ portion of the received parity codeword $R_{1 \times (N+1)}$, and utilizes values of the $R_{1 \times N} H^T_{N \times m}$ product and a received version $r_{m+1}$ of the overall parity bit to determine the estimated output sequence $\hat{X}_{1 \times K}$ as follows:

(i) if $R_{1 \times N} H^T_{N \times m} \neq 0$ and the received overall parity bit $r_{m+1}$ indicates an error, then only odd-parity composite or single error event candidates are considered in generating the output sequence;

(ii) if $R_{1\times N}H^T_{N\times m}\neq 0$ and the received overall parity bit $r_{m+1}$ does not indicate an error, then only even-parity composite or single error event candidates are considered in generating the output sequence;

(iii) if $R_{1\times N}H^T_{N\times m}\neq 0$ and the received overall parity bit $r_{m+1}$ indicates an error, then there is a detected error but the detected error cannot be corrected; and (iv) if $R_{1\times N}H^T_{N\times m}\neq 0$ and the received overall parity bit $r_{m+1}$ does not indicate an error, then there is no detected error.

11. The apparatus of claim 10 wherein the m+1-bit parity-check code is characterized by a value of K=N−m and a rate $$\frac{N-m}{N+1},$$

where N+1 denotes the total number of bits in a given one of the parity codewords.

12. The apparatus of claim 10 wherein the parity generator comprises a single-parity encoder for generating the overall parity bit and a parity generator matrix element for generating an initial codeword based on the m-bit parity-check code, and wherein a given one of the parity codewords of the m+1-bit parity-check code comprises a combination of the initial codeword based on the m-bit parity-check code and the overall parity bit.

13. The apparatus of claim 12 wherein the parity-check matrix element has associated therewith a parity-check matrix $G_{K\times N}$ and processes the input sequence $X_{1\times K}$ using the matrix $G_{K\times N}$ to generate an initial codeword $C_{1\times N}$ based on the m-bit parity-check code.

14. The apparatus of claim 12 wherein the single-parity encoder processes the input sequence $X_{1\times K}$ to generate an overall parity bit $p_{m+1}$, wherein the overall parity bit $p_{m+1}$ is combined with an initial codeword $C_{1\times N}$ based on the m-bit parity-check code to generate the given one of the parity codewords of the m+1-bit parity-check code.

15. An article of manufacture comprising a storage medium for storing one or more software programs for use in parity-check coding of a sequence of information bits, the one or more software programs when executed implementing the steps of:

receiving a sequence of information bits to be subject to the parity-check coding; and applying the sequence of information bits to a parity generator to generate one or more corresponding parity codewords, the parity codewords including the information bits in an encoded form, the parity generator utilizing an m+1-bit parity-check code comprising a combination of an m-bit parity-check code and an overall parity bit, the overall parity bit providing an indication of the parity of a plurality of composite or single error events associated with decoding of the parity codewords;

the one or more parity codewords of the m+1-bit parity-check code being decodable in a parity-check decoder;

wherein the parity-check decoder processes a given received parity codeword $R_{1\times(N+1)}$ to generate an estimated output sequence $\hat{X}_{1\times K}$ that represents an estimate of an input sequence $X_{1\times K}$; and wherein the parity-check decoder generates a product $R_{1\times N}H^T_{N\times m}$ using an $R_{1\times N}$ portion of the received parity codeword $R_{1\times(N+1)}$, and utilizes values of the $R_{1\times N}H^T_{N\times m}$ product and a received version $r_{m+1}$ of the overall parity bit to determine the estimated output sequence $\hat{X}_{1\times K}$ as follows:

(i) if $R_{1\times N}H^T_{N\times m}\neq 0$ and the received overall parity bit $r_{m+1}$ indicates an error, then only odd-parity composite or single error event candidates are considered in generating the output sequence;

(ii) if $R_{1\times N}H^T_{N\times m}\neq 0$ and the received overall parity bit $r_{m+1}$ does not indicate an error, then only even-parity composite or single error event candidates are considered in generating the output sequence;

(iii) if $R_{1\times N}H^T_{N\times m}\neq 0$ and the received overall parity bit $r_{m+1}$ indicates an error, then there is a detected error but the detected error cannot be corrected; and (iv) if $R_{1\times N}H^T_{N\times m}\neq 0$ and the received overall parity bit $r_{m+1}$ does not indicate an error, then there is no detected error.

* * * * *

UNITED STATES PATENT AND TRADEMARK OFFICE
CERTIFICATE OF CORRECTION

PATENT NO.    : 6,543,023 B2                                      Page 1 of 1
DATED         : April 1, 2003
INVENTOR(S)   : Bessios It is certified that error appears in the above-identified patent and that said Letters Patent is hereby corrected as shown below:

Column 9,
Line 61, element (iii), please change "$\neq$" to -- = --.
Line 64, element (iv), please change "$\neq$" to -- = --.

Column 11,
Line 5, element (iii), please change "$\neq$" to -- = --.
Line 8, element (iv), please change "$\neq$" to -- = --.

Column 12,
Line 33, element (iii), please change "$\neq$" to -- = --.
Line 36, element (iv), please change "$\neq$" to -- = --.

Signed and Sealed this

Fifth Day of August, 2003

JAMES E. ROGAN
*Director of the United States Patent and Trademark Office*